(12) United States Patent
Palm et al.

(10) Patent No.: US 10,231,335 B2
(45) Date of Patent: Mar. 12, 2019

(54) ELECTRONIC MODULE WITH EMBEDDED JUMPER CONDUCTOR

(71) Applicant: GE Embedded Electronics Oy, Helsinki (FI)

(72) Inventors: Petteri Palm, Helsinki (FI); Tuomas Waris, Helsinki (FI); Antti Iihola, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 0 days.

(21) Appl. No.: 14/285,710

(22) Filed: May 23, 2014

(65) Prior Publication Data

US 2014/0254107 A1    Sep. 11, 2014

Related U.S. Application Data

(63) Continuation of application No. 12/842,055, filed on Jul. 23, 2010, now Pat. No. 8,735,735.

(51) Int. Cl.
*H05K 1/11* (2006.01)
*H05K 1/18* (2006.01)
(Continued)

(52) U.S. Cl.
CPC ........ *H05K 1/111* (2013.01); *H01L 23/49833* (2013.01); *H01L 23/5381* (2013.01); *H01L 24/19* (2013.01); *H01L 24/24* (2013.01); *H01L 24/25* (2013.01); *H05K 1/181* (2013.01); *H05K 1/185* (2013.01); *H01L 23/5389* (2013.01); *H01L 2223/6677* (2013.01); *H01L 2224/24195* (2013.01); *H01L 2924/01029* (2013.01); *H05K 1/14* (2013.01); *H05K 3/207* (2013.01); *H05K 2201/10363* (2013.01)

(58) Field of Classification Search
CPC .......... H05K 1/111; H05K 1/181; H05K 1/14; H05K 1/18; H05K 1/182; H05K 1/183; H05K 2201/10356
USPC ......... 174/250–268; 361/760–761, 772, 777, 361/792–795; 257/678, 778, 690
See application file for complete search history.

(56) References Cited

U.S. PATENT DOCUMENTS 5,598,031 A * 1/1997 Groover ................ H01L 23/057
257/668
6,353,420 B1   3/2002 Chung
(Continued)

FOREIGN PATENT DOCUMENTS

JP         04221879      8/1992

*Primary Examiner* — Ishwarbhai B Patel
(74) *Attorney, Agent, or Firm* — Seppo Laine Oy

(57) ABSTRACT

The present invention generally provides a novel method for manufacturing an electronic module with crossed conducting lines and a novel electronic module with crossed conducting lines. In particular, an aspect of the present invention is to provide a thin, single layer electronic module. It is also an object of the present invention to provide an electronic module with an embedded jumper element having reliable high quality connections and contacts. To achieve at least some of the aspects of the present invention, an embedded pre-fabricated jumper module is placed inside a printed circuit board which allows the crossing of conducting lines within the module without manufacturing additional layers over the whole PCB board. The resultant PCB will have improved contacts and will not have surface deformation.

18 Claims, 8 Drawing Sheets

(51) Int. Cl.
    *H01L 23/498* (2006.01)
    *H01L 23/538* (2006.01)
    *H01L 23/00* (2006.01)
    *H05K 1/14* (2006.01)
    *H05K 3/20* (2006.01)

(56) References Cited

U.S. PATENT DOCUMENTS

| | | | |
|---|---|---|---|
| 6,422,472 B1 | 7/2002 | Thevenot et al. | |
| 6,665,193 B1 | 12/2003 | Chung et al. | |
| 6,693,541 B2 | 2/2004 | Egbert | |
| 6,812,575 B2* | 11/2004 | Furusawa | H01L 23/5385 |
| | | | 257/774 |
| 6,924,777 B2 | 8/2005 | Reasoner et al. | |
| 6,951,621 B2 | 10/2005 | Hanhikorpi | |
| 6,991,966 B2 | 1/2006 | Tuominen | |
| 7,294,529 B2 | 11/2007 | Tuominen | |
| 7,299,546 B2 | 11/2007 | Tuominen | |
| 7,402,901 B2* | 7/2008 | Hatano | H01L 23/5389 |
| | | | 257/684 |
| 7,609,527 B2 | 10/2009 | Tuominen | |
| 7,663,215 B2 | 2/2010 | Tuominen | |
| 7,673,387 B2 | 3/2010 | Tuominen | |
| 7,696,005 B2 | 4/2010 | Iihola | |
| 7,719,851 B2 | 5/2010 | Tuominen | |
| 7,732,909 B2 | 6/2010 | Tuominen | |
| 7,786,572 B2* | 8/2010 | Chen | H01L 24/49 |
| | | | 257/724 |
| 8,735,735 B2* | 5/2014 | Palm | H01L 23/49833 |
| | | | 174/260 |
| 2002/0135058 A1 | 9/2002 | Asahi et al. | |
| 2007/0267136 A1 | 11/2007 | Tuominen | |
| 2008/0036093 A1 | 2/2008 | Tuominen | |
| 2008/0094805 A1 | 4/2008 | Tuominen | |
| 2008/0196930 A1 | 8/2008 | Tuominen | |
| 2008/0202801 A1 | 8/2008 | Tuominen | |
| 2008/0261338 A1 | 10/2008 | Iihola et al. | |
| 2009/0014872 A1 | 1/2009 | Tuominen | |
| 2009/0133251 A1 | 5/2009 | Tuominen | |
| 2009/0244874 A1* | 10/2009 | Mahajan | H01L 24/16 |
| | | | 361/809 |
| 2009/0260866 A1 | 10/2009 | Palm | |
| 2010/0046186 A1 | 2/2010 | Palm | |
| 2010/0052129 A1 | 3/2010 | Iihola | |
| 2011/0006119 A1* | 1/2011 | Honda | G06K 19/07749 |
| | | | 235/492 |
| 2011/0121085 A1* | 5/2011 | Matsushita | G06K 19/07749 |
| | | | 235/492 |
| 2011/0316572 A1* | 12/2011 | Rahman | G01R 31/2853 |
| | | | 324/754.03 |

* cited by examiner

ELECTRONIC MODULE WITH EMBEDDED JUMPER CONDUCTOR

BACKGROUND OF THE INVENTION

The present invention relates generally to a printed circuit board (PCB) or semiconductor package substrate and a method for allowing local crossing of conductor lines in a PCB or semiconductor package structure. The novel invention is particularly useful in single layer PCB's or semiconductor package structures where a local crossing of conductors may be useful. A single layer application where a conductor crossing must be used is, for instance, an RF antenna module or in a memory card.

When designing a PCB it is advantageous to layout conductor lines so that they do not cross. However, there are certain instances where the crossing of conductor lines is either preferable or unavoidable. While there are several known methods of crossing conductor lines, they each have their own distinct disadvantages.

In US publication US 2002/0135058 there is presented a component built-in module which includes a plurality of wiring patterns in a plurality of layers that are laminated with an electric insulation layer interposed between. Such a module is relatively thick and requires a large number of manufacture steps. Additionally, there is a substantial amount of unutilized space in the multiple layers if a small amount of crossings are present.

In many applications it is preferable to have a printed circuit board with a single layer. This results in PCBs that are easier to manufacture and thinner overall. In order to accommodate conductor line crossing there are normally jumpers attached on top of the PCB.

U.S. Pat. No. 6,665,193 presents an electronic circuit arrangement wherein an electronic jumper is connected to a substrate including two contacts spaced apart substantially a predetermined distance. The electronic jumper is placed on a surface of the substrate. There are several drawbacks to such a jumper. First, the resultant module is no longer flat which can make its incorporation in to a system difficult. Second, the contact between the jumper, PCB and conductor lines is not optimal since it is often soldered or chemically adhered.

Japanese patent publication JP 04-221879 describes a jumper on a printed circuit board which attempts to overcome the first problem mentioned above. By providing a concaved surface or a complex shape on the surface of the PCB, a jumper can be affixed without leaving a protrusion. While this overcomes one of the deficiencies in U.S. Pat. No. 6,665,193, it requires more complex manufacturing and still does not address the less than optimal contact of the jumper.

Herein will be described a novel electronic module and method for making which overcomes the deficiencies of the prior art.

SUMMARY OF THE INVENTION

Generally, the present invention provides a novel method for manufacturing an electronic module with crossed conducting lines. Additionally, the present invention provides a novel electronic module with crossed conducting lines.

In particular, an aspect of the present invention is to provide a thin, single layer electronic module. It is also an object of the present invention to provide an electronic module with an embedded jumper element having reliable high quality connections and contacts.

To achieve at least some of the aspects of the present invention, an embedded pre-fabricated jumper module is described herein. The pre-fabricated jumper is placed inside a printed circuit board which allows the crossing of conducting lines within the module without manufacturing additional layers over the whole PCB board. The resultant PCB will have improved contacts over the prior art and will not have surface deformation like the prior art.

The electronic module of the present invention is manufactured in an efficient and cost saving manner. One example of manufacturing is by way of pick and place assembly. Additionally, introducing a pre-fabricated horizontal jumper element in accordance with the present invention can be accomplished by utilizing embedded placing technology.

The embedded jumper element can be manufactured by using PCB manufacturing processes and materials. According to an embodiment of the invention an FR4 laminate with Cu traces can be manufactured with conductive traces/surface on one or both sides of the core. The embedded jumper element can take the form of a line, rectangular, T-shape, L-shape, frame-like shape or any other geometric type of shape. The element can be placed or embedded in any location on a mother board or substrate and it can be used by one or more of several final products. The layout pattern of the conductor lines and pads can be standard or unique.

Advantages of the present invention are that a pre-fabricated jumper element enables manufacturing of crossed conductor lines without manufacturing additional entire build-up layers or build-in layers. Also a jumper element according to an object of the invention may not cause any protrusions to an outer shape of an electronic module. Additionally, an embedded jumper element also provides reliability as the jumper element can be manufactured from the same material as the surrounding PCB or semiconductor package.

An additional advantage is that the embedded jumper element provides reliable connections between the components and wiring layer. This is due to the connections being preferably both solder-less and metallurgic.

A generous improved reliability can be achieved by an embedded jumper element. According to an embodiment of the invention an embedded jumper element of printed circuit board material with copper (Cu) traces are full and uniform metal and thus very reliable when exposed on thermal cycling or drop testing.

By using a jumper element according to an object of the present invention, denser conductor structure can be achieved. Also by locating a jumper element precisely, alignment accuracy can be maintained at a high level.

Due to the small component size of the embedded jumper element, compared to microcircuit chips, there can be several jumper elements inside a single electronic module. Furthermore, multiple jumper elements need not to be similar to each other and may vary a lot from, for example, a single conductor juniper element to a jumper element having plurality of jumper conductors.

For a more complete understanding of the present invention and the advantages thereof, the invention is now described with the aid of the examples and with reference to the following drawings.

DETAILED DESCRIPTION OF EXEMPLARY EMBODIMENTS

Figure 1A:
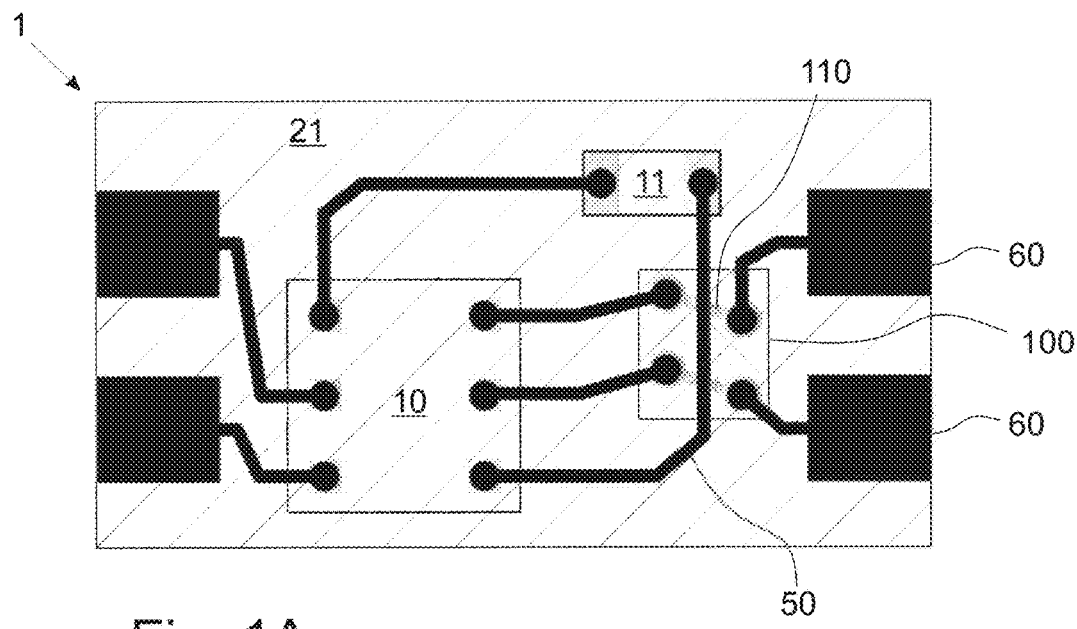
FIG. 1A presents a schematic top view of an electronic module having an embedded jumper element.

FIG. 1A presents a schematic top view of an electronic module having crossed conductor lines. The electronic module 1 contains a microcircuit chip 10, which is embedded in a substrate 21, connected to an embedded passive component 11 and contact areas 60. There is one conductor 50 that must be jumped by two other conductors. All of the conductors are on the same level, i.e. at only one wiring layer 41.

Embedded in the electronic module 1 there is a jumper element 100. The jumper element includes juniper conductors 110 embedded inside a substrate 21. The jumper element 100 is aligned beneath conductor 50 so that the conductor can be jumped.

Figure 1B:
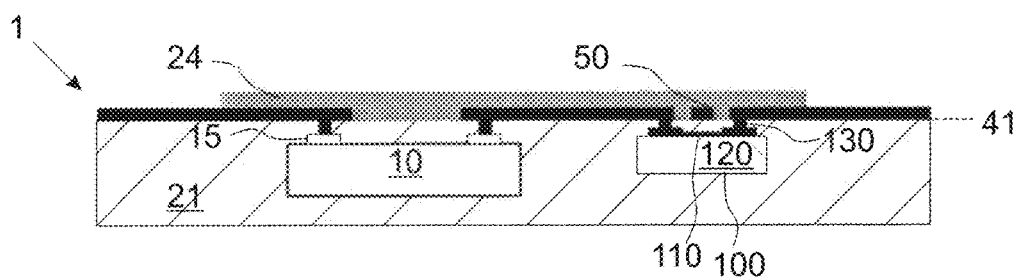
FIG. 1B presents a schematic cross profile of the electronic module of FIG. 1A.

FIG. 1B presents a schematic cross profile of the same electronic module 1 presented in the FIG. 1A. The microcircuit chip 10 and jumper element 100 are both embedded in the substrate 21. The jumper element 100 contains two jumper conductors 110 and a supporting part 120. Additionally, the single wiring layer 41 is shown and there is a soldering mask 24 covering at least a portion of the single wiring layer.

The supporting part 120 is preferably an insulating material such as FR4, PI or similar insulating material. The insulating material 120 can be the same as, or similar to that used in the substrate 21. Alternatively, the insulating material 120 can be different from that used in the substrate 21.

The jumper conductors 110 are shown on the supporting part 120. However, jumper conductors 110 can also reside inside the supporting part 120 and have lands on surface of the supporting part 120. Jumper conductors 110 comprise the actual jumping conductor but may also include lands at the ends of the jumping conductor. Jumper conductors 110 are ready made onto, or inside, the supporting part 120.

The embedding of components, i.e. the microcircuit chip 10, passive component 11 and jumper element 100 can be accomplished by any known compatible method. Examples of useful methods for embedding are cavity embedding, face down and face up embedding, etc. Additionally, the conventional connecting of components and any contact pads 15 to the wiring layer 41 can be accomplished by any known compatible method. One useful method for connecting the components is using microvias 130. Further examples of these methods are described in the following patents and patent applications: U.S. Pat. Nos. 6,991,966; 7,294,529; 7,299,546; 7,609,527; 7,663,215; 7,673,387; 7,696,005; U.S. Ser. No. 11/797,609; U.S. Ser. No. 11/878,557; U.S. Ser. No. 12/603,324; U.S. Ser. No. 11/570,673; U.S. Ser. No. 11/667,429; U.S. Ser. No. 11/791,547; U.S. Ser. No. 11/587,586; U.S. Ser. No. 11/917,724; U.S. Ser. No. 11/917,711; U.S. Ser. No. 11/917,737; U.S. Ser. No. 12/293,412; U.S. Ser. No. 12/506,519; U.S. Ser. No. 12/420,617 and U.S. Ser. No. 12/546,454 which are herein incorporated by reference.

Figure 2:
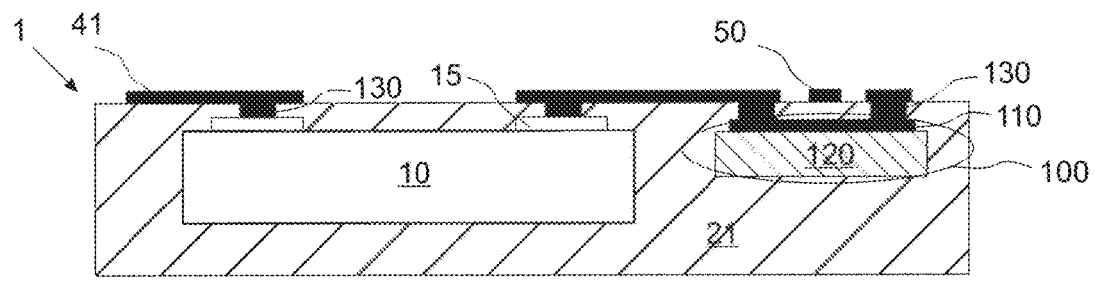
FIG. 2 presents a schematic cross profile of an electronic module without a solder mask.

FIG. 2 presents a schematic cross section view of an electronic module similar to that of FIG. 1B. However, FIG. 2 shows the wiring layer 41 void of a soldering mask. The microcircuit chip 10 has contact pads 15 which are connected to the first wiring layer 41 by means of microvias 130. Likewise the jumper element 100 is connected to the first wiring layer 41 by means of microvias 130. There is also shown insulating material in-between the jumper conductors 110 and the conductor to be jumped 50. This insulating material is preferably that of substrate 21. However, the insulating material between the conductors can be similar to substrate 21, the same or similar to supporting part 120, or alternatively it can be a separate insulating material different from that of 21 and 120.

Figure 3:
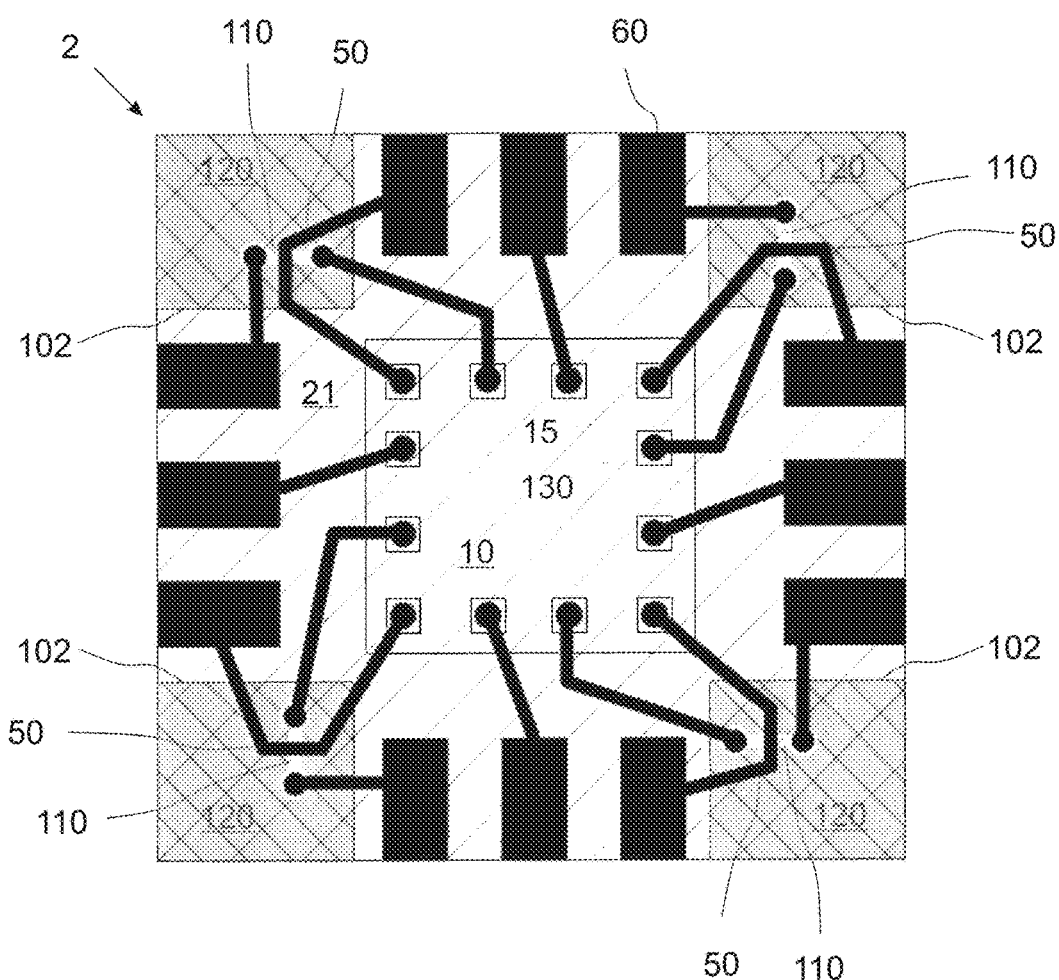
FIG. 3 presents a schematic top view of an electronic module with several embedded jumper elements at the four corners.

FIG. 3 presents a schematic top view of an electronic module 2 having multiple jumper elements 102 located at the corners of the module. A microcircuit chip 10 is embedded inside a substrate 21. Each jumper element 102 contains one jumper conductor 110 and a supporting part 120, in more complex electronic modules there can be multiple jumper conductors 110 in one or more of the jumper elements.

The microcircuit chip 10 has contact pads 15 which are connected to the first wiring layer by means of microvias 130. Likewise the conductor ends of each jumper element 102 are connected to the first wiring layer by means of microvias 130. Placing the insulation between the conductors to be jumped 50, and jumper conductors 110 can be accomplished through various methods.

There has been a long felt need in the art to easily cross conductor lines at the corner of electronic modules such as that shown in FIG. 3. Locally embedding a jumper element at each corner where such a crossing is desired allows for the most compact and efficient module design. Though FIG. 3 shows similar jumper elements at each of the four corners, there can be jumper elements at less than four corners. Additionally, each jumper element can be different so as to conform to the design requirements of each corner.

Figure 4:
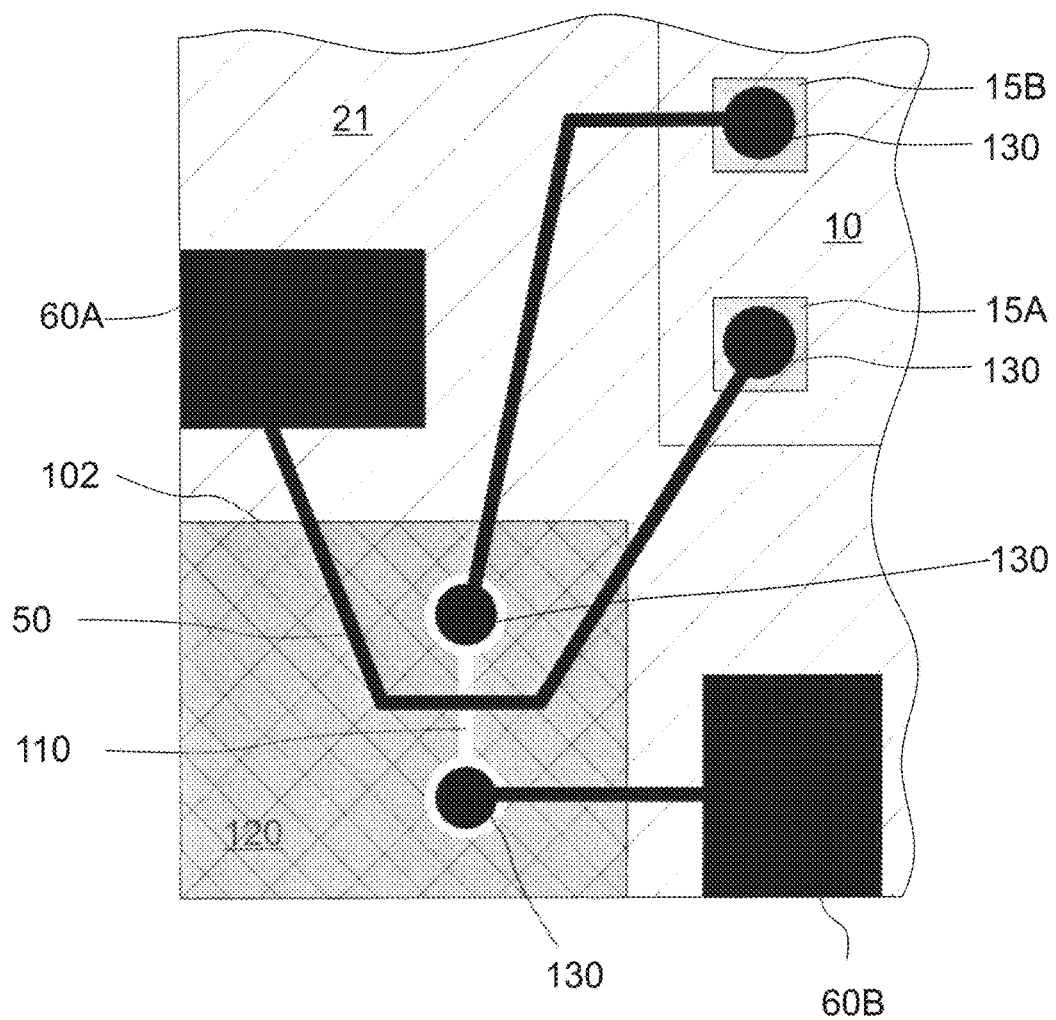
FIG. 4 presents a partial enlargement of a corner of the electronic module in FIG. 3.

FIG. 4 presents an enlargement of the lower left corner of the electronic module 2 shown in FIG. 3. The design in the present example requires that, from the microcircuit chip 10, the lowest left-hand side contact pad 15A should be coupled to the lowest contact area 60A on left-hand side row of contact areas of the electronic module 2. Likewise, the second lowest left-hand side contact pad 15B of the microcircuit chip 10 should be coupled to the most leftward contact area 60B on bottom side row of contact areas of the electronic module 2.

In traditional single wiring layer applications, this kind of design requirement is impossible to implement without manufacturing a build-up layer or the like. In the case that there is a build-up layer then the topography of the module surface can become uneven or the overall thickness of the module can increase to an undesirable size. Similar drawbacks as associated with each traditional method as described above. Particularly, in examples such as presented in FIG. 4, when there are only a small number of conductor lines to be jumped traditional methods are extremely inefficient and costly.

In FIG. 4, the jumper element 102 is embedded inside a substrate 21. All the microvias 130, those associated with the component and the jumper element, can be manufactured at the same time. For example, the microvias can be created by first using chemical deposition metallization and then electrochemical plating. Other methods, as described in the patents and applications above, as well as those known in the art can be used to form the microvias.

In certain instances, it is preferable to manufacture the microvias associated with the component and those associated with the jumper element in separate steps; sequentially, or at separate times using similar or different methods. In one embodiment, the microvias associated with the jumper element are prefabricated with the jumper element at a time separate from when the microvias associated with the component are formed. In such an embodiment, the microvias are often formed by different methods.

Figure 5:
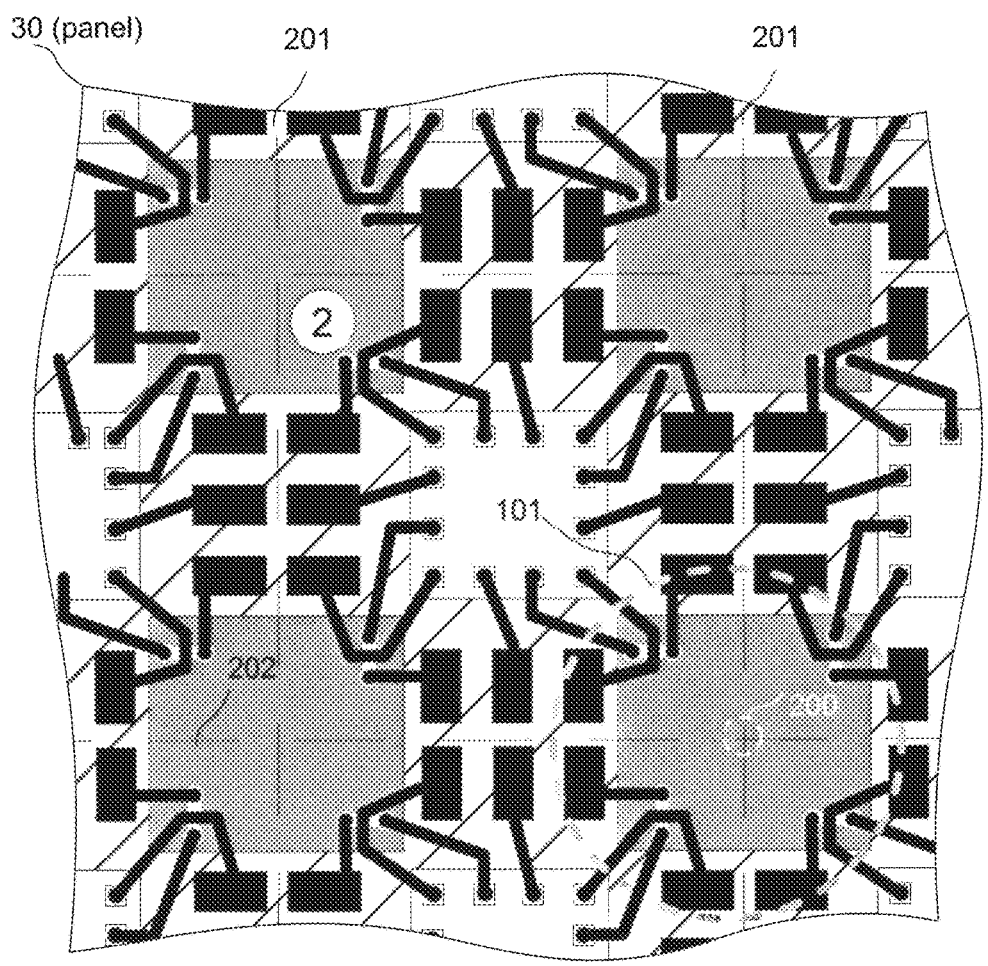
FIG. 5 presents a schematic top view of a part of panel having several electronic modules.

FIG. 5 presents a schematic top view of a portion of a panel 30 of electronic modules 2. One full electronic module 2 is shown in the center of the panel 30. Surrounding the full module are portions of identical modules as shown in FIG. 3. It can be seen from FIG. 5 that instead of embedding a jumper element in each corner of an electronic module, a single jumper element 101 can be embedded between four electronic modules in a panel, at position 200. When the panel is cut along first cut lines 201 and second cut lines 202, there are produced multiple electronic modules with a quarter of each jumper element 101 now disposed at each of its corners making up jumper elements 102 respectively.

Utilizing the jumper elements of the present invention in a panel, designers of electronic modules can utilize the corners of said modules extremely efficiently. As noted earlier, it is often unavoidable to design crossing conductor lines around the corners of electronic modules. Traditionally, these corners have been problematic for designers and result in electronic modules that are unnecessarily thick or costly. By using the jumper elements as described here, designing crossing conductor lines at the corners becomes the most efficient place to put them. Other efficiencies of having embedded jumper elements at the corners of electronic modules will be readily apparent to those skilled in the art.

Figure 6:
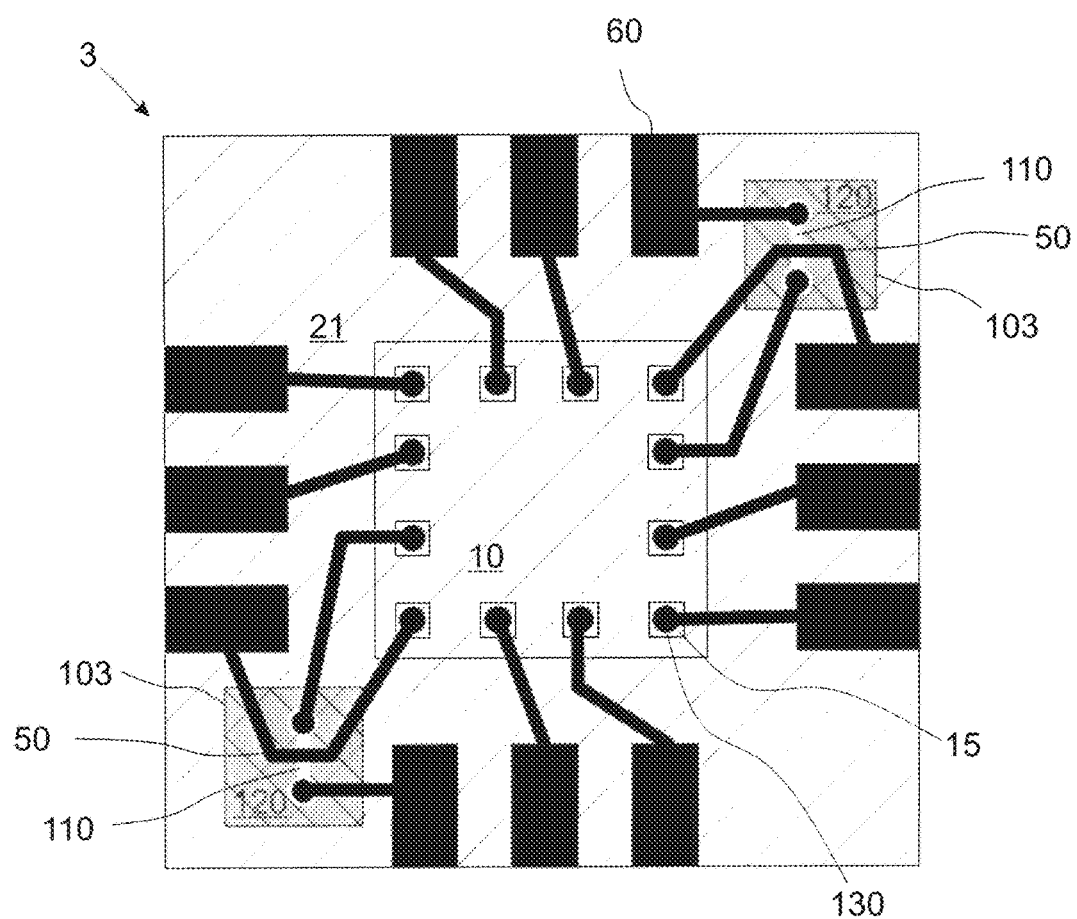
FIG. 6 presents a schematic top view of an electronic module having two embedded jumper elements recessed from the edges of the module.

FIG. 6 presents a schematic top view of an electronic module 3 having two jumper elements 103 embedded near two opposing corners of the module. A microcircuit chip 10 is embedded inside a substrate 21 of the module 3. In the electronic module 3 there are embedded two jumper elements 103 slightly displaced from opposite corners of the electronic module 3. The embedded jumper elements 103 do not extend to the edge of the electronic module 3. Jumper elements 103 need not be shaped as a square or rectangular. One or more of the jumper elements 103 can be shaped such as a bar, line, T-shaped, L-shaped, frame-like, cross, cylinder, semi-cylinder or other non-enumerated geometric shape.

Figure 7:
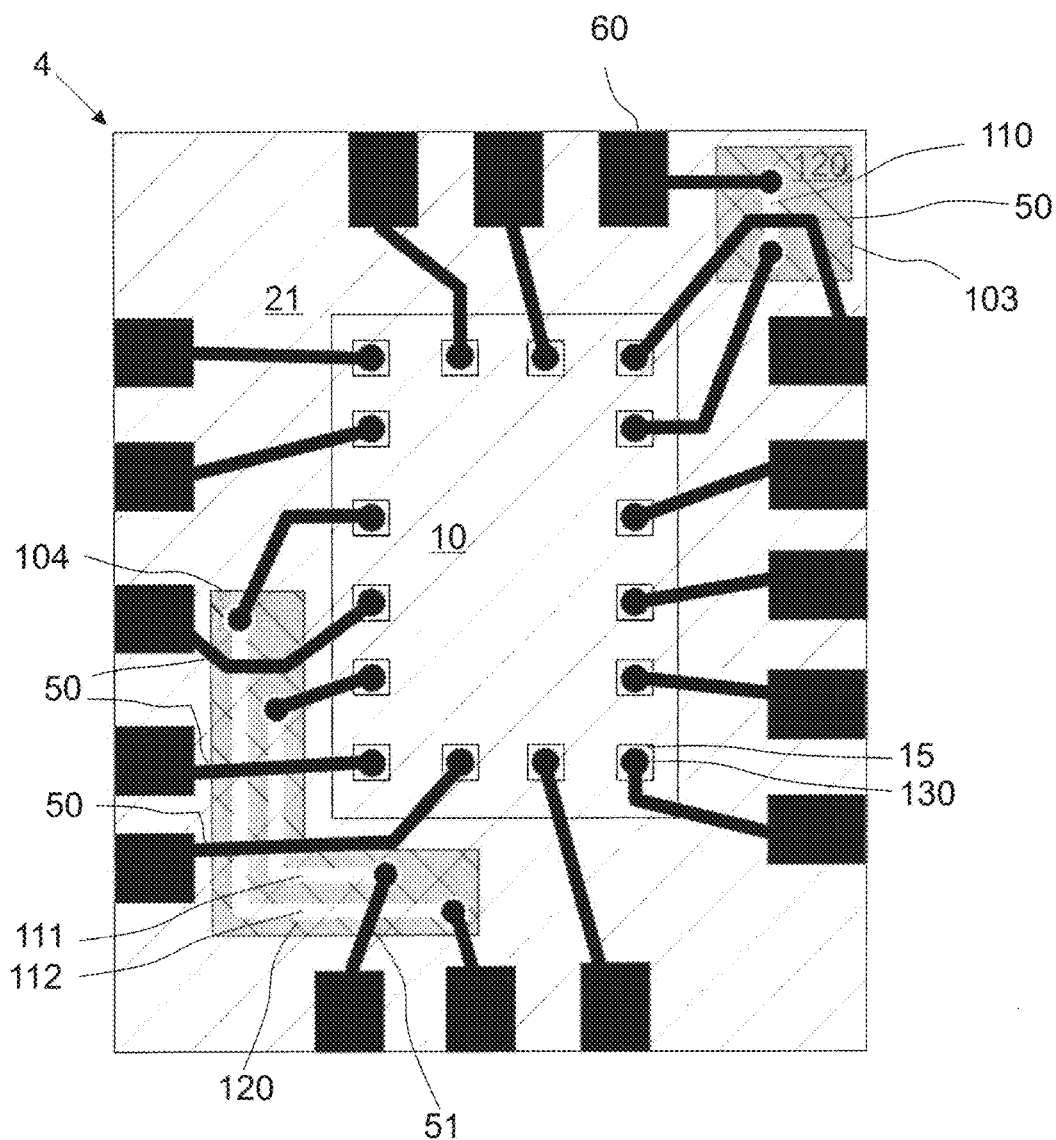
FIG. 7 presents a schematic top view of an electronic module having two embedded jumper elements, each having a unique design.

FIG. 7 presents a schematic top view of an electronic module 4 having two unique jumper elements 103 and 104. Juniper element 103 has a square shape and is deposed in a corner region of the electronic module 4 similar to electronic module 3. Jumper element 104 is deposed in an opposing corner of the electronic module 4 and has a different geometric design than jumper element 103. FIG. 7 shows the substrate 21 separating both jumper elements from the component 10 and the outer edge of the electronic module. However, one or more of the jumper elements can be located at the corner as shown in FIGS. 3-5.

Jumper element 103 connects one contact from component 10 to one contact area 60 using a single jumper conductor 110. Jumper element 103 uses the single jumper conductor to jump a single conductor line 50. Jumper element 104 connects two contacts from the same component 10 to two respective contact areas 60 using two separated jumper conductors 111 and 112.

The inner jumper conductor 111 of jumper element 104 is used to jump two conductor lines 50 extending from the component 10 across the jumper element. The outer jumper conductor 112 is used to jump three conductor lines 50 extending from the component 10 across the jumper element. Additionally, the outer jumper conductor 112 is used to jump conductor line 51 which extends from the inner juniper conductor 111 across the remaining portion of the jumper element.

Figure 8:
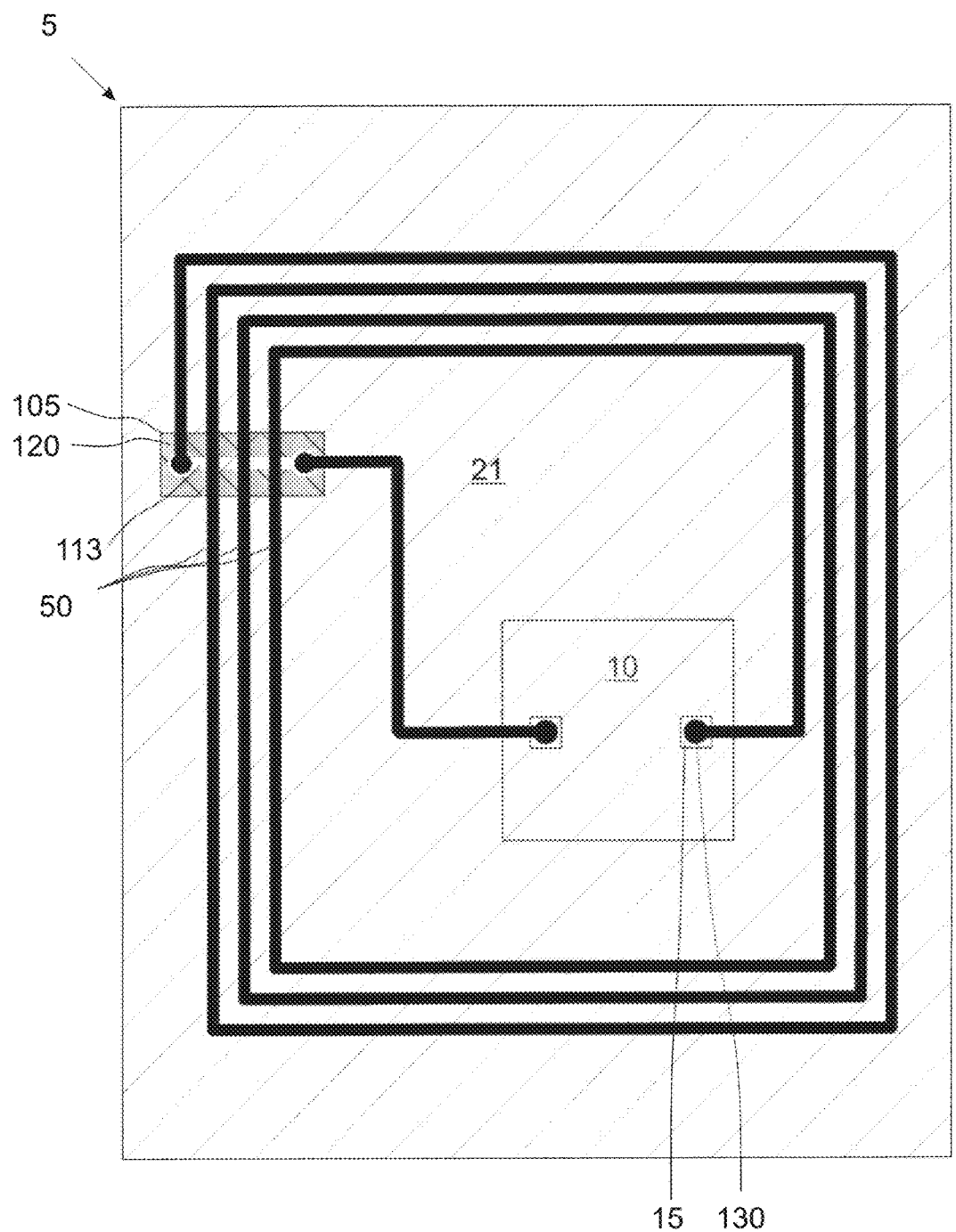
FIG. 8 presents a schematic top view of an electronic module having a single, linear embedded juniper element.

FIG. 8 presents a schematic top view of an electronic module 5 according to an embodiment of an RF antenna. A single jumper element 105 is located embedded in the substrate 21 away from any corner and at a distance from the edge of the electronic module. A single conductor line 50 extends from a first contact of a component 10 around the component in a squared spiral having several loops. The single conductor line 50 passes over the single embedded jumper element 105 several times in a local area. Then second end of conductor line 50 is connected to the outer contact of jumper conductor 113 which jumps the number of loops made by conductor line 50. The inner contact of jumper conductor 113 is then connected via a second conductor line back to the second contact of component 10 firming an antenna.

Jumper elements are shown in the figures as being smaller in size than the components. It is preferable to have small, local jumper elements to reduce material and manufacturing cost.

In an embodiment embedding at least one microcircuit chip, each of the jumper elements in the final module has a surface area comparable to, or smaller than, the surface area of the largest microcircuit chip embedded in the module. The surface area of the jumper elements can be, for example, between 0.1 . . . 2 times the surface area of the largest microcircuit chip embedded in the module. In some embodiments, the above-stated ratio is typically less than 1 and can be even less than 0.5 for each jumper element in the final module.

In an embodiment, the support substrate 120 forming the geometry of the jumper elements is not substantially larger than required to support any or all of the juniper conductors associated with the jumper element. Additionally, as shown in FIG. 7, the support substrate ideally corresponds to the path of the jumper conductors when aiming at small modules, for instance. Alternatively, the geometry of the jumper elements can be designed for easy mounting even though this may take up more space. For example, the shape of the jumper elements can be made to correspond to the shape of the components, i.e. be rectangular, for instance, even when the jumper conductors would not suggest such a rectangular shape.

While it is often preferable for the surface area of the jumper elements to remain as small as possible and to confine the size of the jumper elements to local positions contoured to the path of the jumper conductors and around intersections or crossings, larger jumper elements can also have their benefit as will be discussed below.

Single wiring layer electronic modules may also include one or more semiconductor chips. It should be noted that embodiments are not limited to be used in context with embedded component but can be actually utilized with "conventional" printed circuit boards and substrates where IC's, discrete and all other component are assembled in conventional methods such as surface mount technology, or SMT. Additionally, the present invention can be utilized within single wiring layers of multilayer electronic modules.

In any embodiment of the invention a jumper element can be considered as an embedded component or a local build-in structure. The dimensions of conductor lands and microvias of a jumper element are typically, but not necessarily, 80 μm and 30-50 μm. Additionally, the alignment accuracy of a jumper element can easily achieve 90 μm or greater.

While embedded jumper element 104 is shown with two jumper connectors, a jumper element can contain any number of jumper connectors, can jump any number of conductor lines and can connect any types of connections. The present invention provides the greatest benefits when the number of conductor lines needing to be jumped is either small. The present invention also provides substantial benefit when there are a larger number of conductor lines that need to be jumped but they are located relatively near each other in a localized portion of an electronic module. This is due to the fact that an entire addition wiring layer is made unnecessary by the present invention minimizing wasted space and wasteful manufacturing steps.

Though the greatest benefits are in the situations described above, there are benefits associated with other embodiments where larger embedded jumper elements connect numerous contacts and jump larger numbers of conductor lines across vast regions of the electronic modules. Therefore, the present invention is not limited to the explicit examples shown in the figures and described herein.

The advantages of the present invention are numerous. The outer shape of electronic modules can remain straight or flat on every surface, no jumper protrusions. In the manufacturing phase there can be savings in costs where otherwise a build-up layer or an outer jumper element would have otherwise been necessary to process. One of the most important advantages is that all of the conductors are substantially in one wiring layer and only in the point of conductor crossing are there conductors in separate layers. Additional advantages are that there are reliable electrical connections over the jumper element made by metallurgical contacts and the jumper elements can be prefabricated.

LIST OF REFERENCE NUMBERS

1 Electronic module with single jumper element
2 Electronic module with four jumper elements, one at each corner
3 Electronic module with similar jumper elements at opposite corners
4 Electronic module with different jumper elements at opposite corners
5 Electronic module with antenna
10 Component, microcircuit chip having several contact pads
11 Component, passive component e.g. a resistor or capacitor
15 Contact pad of a component 10
15A Specific contact pad of component 10
15B Specific contact pad of component 10
21 Substrate, dielectric composite e.g. FR4, PI or similar
24 Solder mask
30 Panel
41 First wiring layer
50 Conductor line that is jumped across a jumper element
51 Conductor line that crosses only a portion of a jumper element
60 Contact area of an electronic
60A A specific contact area of an electronic module
60B Another specific contact area of an electronic module
100 A jumper element
101 An unbroken jumper element in a panel
102 A piece of jumper element 101
103 A jumper element located at but not touching a corner
104 A jumper element with multiple jumper conductors at a corner
105 A jumper element of an antenna
110 Conductor of a jumper element
111 Inner conductor of a jumper element having two conductors
112 Outer conductor of a jumper element having two conductors
120 Supporting part of a jumper element
130 Microvia between an embedded component and a wiring layer
200 Corner point of four different electronic modules
201 First dicing street
202 Second dicing street

The invention claimed is:

1. An electronic module, comprising;
a wiring layer supported by a first substrate and having multiple conducting lines,
a component with more than one contact terminal electrically connected to the conducting lines of the wiring layer,
a jumper element completely embedded in the first substrate at a position separated from the component by the first substrate, said jumper element having a supporting substrate supporting at least one jumper conductor, and the at least one jumper conductor being electrically connected to the wiring layer and positioned to allow the path of at least one conducting line to cross the jumper conductor without contacting the jumper conductor,
wherein the jumper element and the component are embedded in the substrate at the same distance from the wiring layer.

2. An electronic module according to claim 1, further comprising a second jumper element, wherein the jumper elements are of similar geometric design and have the same number of jumper conductors.

3. An electronic module according to claim 2, wherein at least one of the jumper elements is located at an edge of the electronic module and is a portion of a larger jumper element which has been divided when cutting the electronic module from a panel of electronic modules.

4. An electronic module according to claim 1, further comprising at least one other jumper element wherein at least two of the jumper elements have a different geometric design or number of jumper conductors.

5. An electronic module according to claim 1, wherein the jumper element is located on the side of a first surface of the wiring layer, and the component is embedded inside the first substrate on the side of the first surface of the wiring layer.

6. An electronic module according to claim 1, wherein the jumper element is a portion divided from a single-layer circuit board and thereby includes the jumper conductor in a single layer.

7. An electronic module according to claim 1, wherein the component is electrically connected to the conducting lines of the wiring layer by means of first microvias, the jumper conductor is electrically connected to the conducting lines of the wiring layer by means of second microvias, and said first and second microvias are similar in structure.

8. An electronic module according to claim 1, wherein the jumper elements are prefabricated elements manufactured prior to embedding in the first substrate.

9. An electronic module according to claim 1, wherein the jumper conductors are conducting lines manufactured on the surface of the supporting substrates.

10. An electronic module according to claim 1, wherein the component is electrically connected to the conducting lines of the wiring layer by means of first microvias.

11. An electronic module according to claim 10, wherein at least one jumper conductor is electrically connected to the conducting lines of the wiring layer by means of second microvias.

12. An electronic module according to claim 1, wherein the electrical connections between the component and the wiring layer are solderless and metallurgic connections.

13. An electronic module according to claim 1, wherein the electrical connections between the jumper conductor and the wiring layer are solderless and metallurgic connections.

14. An electronic module according to claim 1, wherein the surface area of the jumper element is smaller than the surface area of the component.

15. An electronic module, comprising;
a wiring layer supported by a substrate and having multiple conducting lines,
a component at least partially embedded in the substrate with more than one contact terminal electrically connected to the conducting lines of the wiring layer,
a jumper element, completely embedded in the substrate at a position separated from the component by the first substrate, and wherein the jumper element has at least one jumper conductor, and
wherein the at least one jumper conductor is electrically connected to the wiring layer and positioned to allow the path of at least one conducting line to cross the jumper conductor without contacting the jumper conductor and wherein the jumper element and the component are embedded in the substrate at the same distance from the wiring layer.

16. An electronic module according to claim 15, wherein the jumper element contains multiple jumper conductors positioned to allow the path of at least one conducting line to cross each jumper conductor without contacting any of the jumper conductors.

17. An electronic module according to claim 16, wherein there is a portion of the first substrate between jumper conductor and the crossing conducting line of the wiring layer which prohibits contact between the two.

18. An electronic module, comprising;
a wiring layer supported by a first substrate and having multiple conducting lines,
a component with more than one contact terminal electrically connected to the conducting lines of the wiring layer,
at least one jumper element completely embedded in the first substrate, the at least one jumper element having a supporting substrate supporting at least one jumper conductor, and the at least one jumper conductor being electrically connected to the wiring layer and positioned to allow the path of at least one conducting line to cross the jumper conductor without contacting the jumper conductor and wherein the shape of the supporting substrate follows the path of the jumper element,
wherein the jumper element and the component are embedded in the substrate at the same distance from the wiring layer.

* * * * *